United States Patent
Tseng et al.

(10) Patent No.: US 10,812,017 B1
(45) Date of Patent: Oct. 20, 2020

(54) SEMICONDUCTOR PACKAGE STRUCTURE

(71) Applicant: Advanced Semiconductor Engineering, Inc., Kaohsiung (TW)

(72) Inventors: Chi Sheng Tseng, Kaohsiung (TW); Lu-Ming Lai, Kaohsiung (TW); Ching-Han Huang, Kaohsiung (TW); Hui-Chung Liu, Kaohsiung (TW); Kuo-Hua Lai, Kaohsiung (TW); Cheng-Ling Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/530,710

(22) Filed: Aug. 2, 2019

(51) Int. Cl.
| | |
|---|---|
| *H03B 5/04* | (2006.01) |
| *H01L 23/13* | (2006.01) |
| *H01L 23/00* | (2006.01) |
| *H01L 23/36* | (2006.01) |
| *H03B 5/30* | (2006.01) |
| *H01L 23/14* | (2006.01) |
| *B81B 7/00* | (2006.01) |
| *H03B 5/36* | (2006.01) |
| *H03L 1/04* | (2006.01) |
| *H03B 1/02* | (2006.01) |

(52) U.S. Cl.
CPC .............. *H03B 5/04* (2013.01); *B81B 7/0077* (2013.01); *H01L 23/13* (2013.01); *H01L 23/145* (2013.01); *H01L 23/36* (2013.01); *H01L 24/32* (2013.01); *H03B 1/02* (2013.01); *H03B 5/30* (2013.01); *H03B 5/36* (2013.01); *H03L 1/04* (2013.01); *B81B 2207/012* (2013.01); *H01L 2924/1461* (2013.01)

(58) Field of Classification Search
CPC ... H03B 5/30; H03B 5/32; H03B 5/36; H03B 1/02; H03B 5/04; H03L 1/04; B81B 7/0032; B81B 7/0035; B81B 7/0077; B81B 7/0096; B81B 7/009; B81B 2207/012; H01L 23/145; H01L 24/26; H01L 2924/1461
See application file for complete search history.

(56) References Cited

U.S. PATENT DOCUMENTS

| | | | | |
|---|---|---|---|---|
| 7,589,599 | B2* | 9/2009 | Wacker | H03L 1/04 310/315 |
| 8,686,555 | B2* | 4/2014 | Yaralioglu | H01L 23/345 257/704 |
| 9,178,469 | B2* | 11/2015 | Kondo | H03B 5/30 |
| 9,287,881 | B2* | 3/2016 | Shimodaira | H03H 9/17 |
| 9,856,136 | B2* | 1/2018 | Meyer | H01L 24/19 |
| 2006/0290239 | A1* | 12/2006 | Kasahara | H03H 9/0514 310/346 |

FOREIGN PATENT DOCUMENTS

TW     201037800 A1 * 10/2010

* cited by examiner

*Primary Examiner* — Ryan Johnson
(74) *Attorney, Agent, or Firm* — Foley & Lardner LLP

(57) ABSTRACT

A semiconductor package structure includes an organic substrate having a first surface, a first recess depressed from the first surface, a first chip over the first surface and covering the first recess, thereby defining a first cavity enclosed by a back surface of the first chip and the first recess, and a second chip over the first chip. The first cavity is an air cavity or a vacuum cavity.

17 Claims, 15 Drawing Sheets

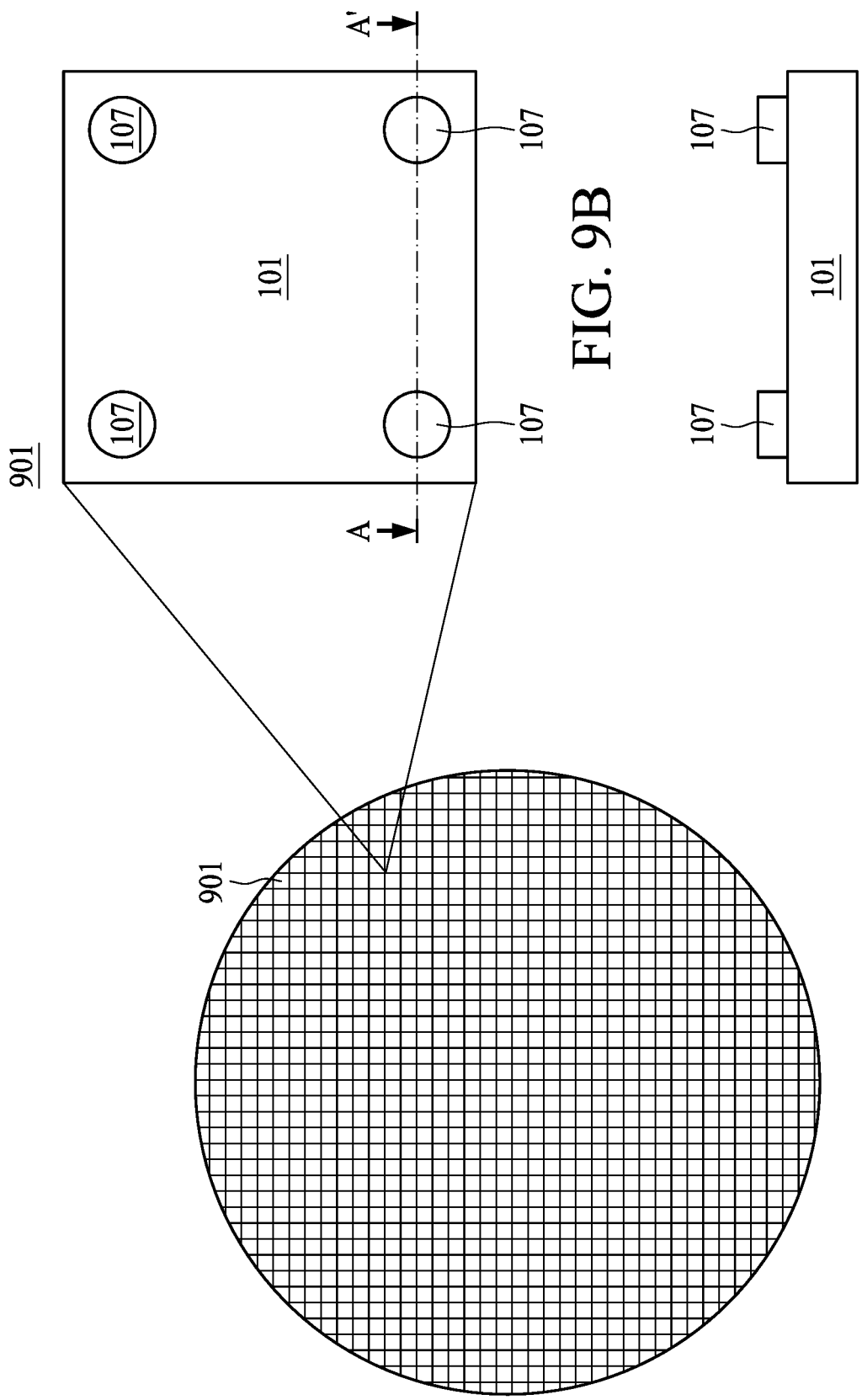

US 10,812,017 B1

SEMICONDUCTOR PACKAGE STRUCTURE

BACKGROUND

1. Technical Field

The present disclosure relates to a semiconductor package structure, particularly to a semiconductor package structure having an oscillator chip.

2. Description of the Related Art

A crystal oscillator includes a crystal unit composed of a quartz crystal blank hermetically encapsulated in a container and an oscillation circuit that uses the crystal unit. The crystal oscillator is used in various electronic apparatuses as a reference source for frequency and time. One of such crystal oscillator is an oven-controlled crystal oscillator (OCXO) that maintains operating temperature of the crystal unit constant. Since the operating temperature of the crystal unit is maintained constant regardless of ambient temperature, OCXO offers particularly high frequency stability, and exhibits little frequency deviation. Such OCXO is used in, for example, communication facilities such as base stations.

SUMMARY

In some embodiments, the present disclosure provides a semiconductor package structure including an organic substrate having a first surface, a first recess depressed from the first surface, a first chip over the first surface and covering the first recess, thereby defining a first cavity enclosed by a back surface of the first chip and the first recess, and a second chip over the first chip. The first cavity is an air cavity or a vacuum cavity.

In some embodiments, the present disclosure provides a semiconductor package structure including an organic substrate having a first surface, a first chip over the first surface and connecting to the first surface via a spacing pattern, thereby defining a first cavity enclosed by a back surface of the first chip, the spacing pattern, and the first surface of the organic substrate, and a second chip over the first chip. The first cavity is an air cavity or a vacuum cavity.

In some embodiments, the present disclosure provides a semiconductor package structure including a substrate having a first surface, a control chip over the first surface, the control chip having a heat source region adjacent to an active surface of the control chip, an oscillator chip over the control chip, thermally conducting with the heat source region, and a heat conduction retardation zone under a passive surface of the control chip and overlapping with a vertical projection area of the heat source region. The heat conduction retardation zone is defined by the passive surface of the control chip and the first surface of the substrate.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 9A illustrates a top view of a semiconductor wafer with a plurality of die regions, according to some embodiments of the present disclosure.

FIG. 9B illustrates one of the plurality of die regions in FIG. 9A with a spacing pattern from a top view perspective, according to some embodiments of the present disclosure.

FIG. 9C illustrates one of the plurality of die regions in FIG. 9A with a spacing pattern from a cross sectional view perspective, according to some embodiments of the present disclosure.

DETAILED DESCRIPTION

Figure 1:
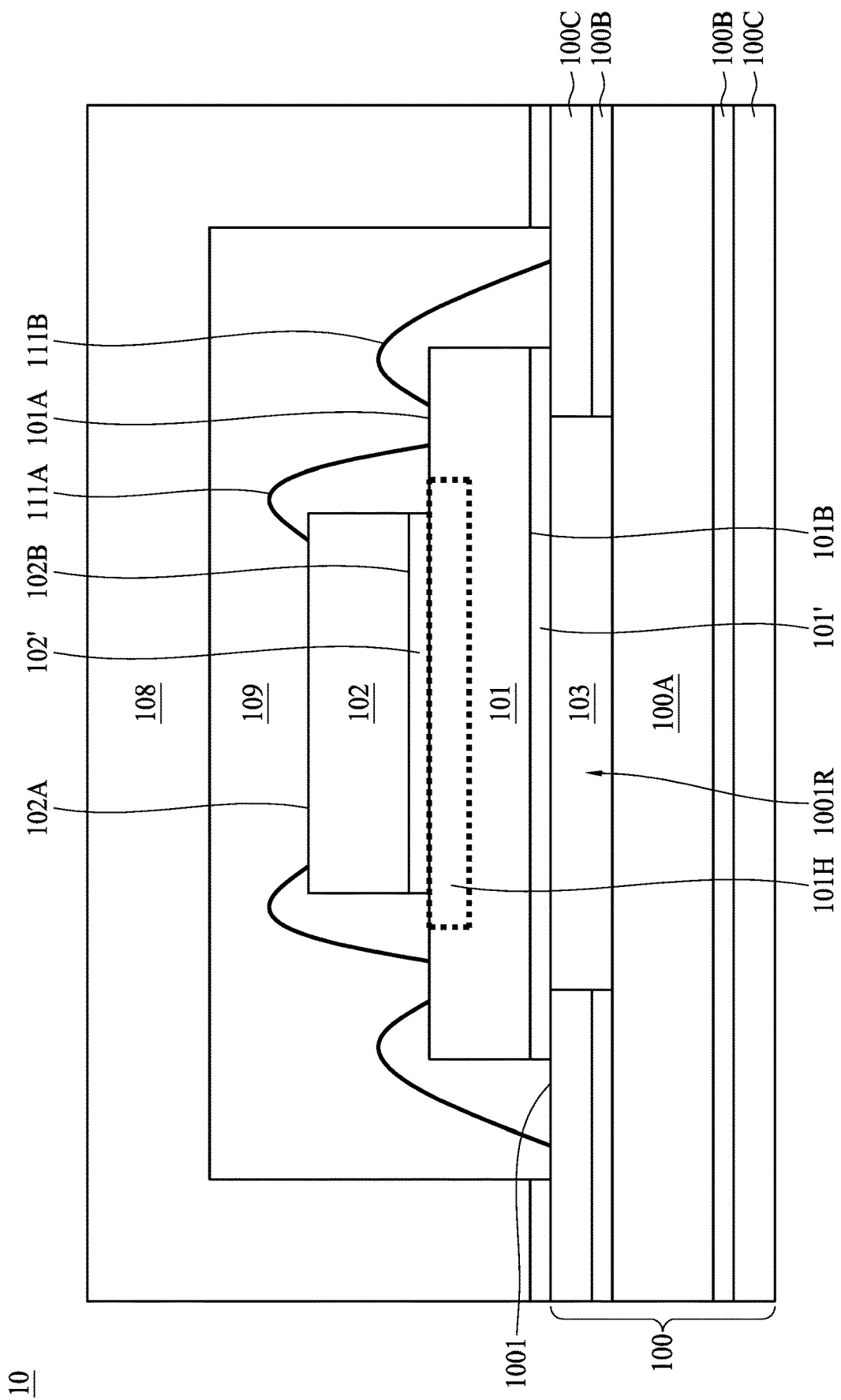
FIG. 1 illustrates a cross-sectional view of a semiconductor package structure, according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

To maintain the crystal unit in the OCXO at a constant temperature, a thermostatic device is generally used. With increasing miniaturization of communication facilities, the OCXO should be small. OCXO having a microelectromechanical system (MEMS) oscillator adopts a complicated stacking structure or high cost material to enhance the temperature control ability. For example, the MEMS oscillator and the oscillation circuit may be packaged on a ceramic cavity substrate, and hermetically sealed by a lid over the ceramic cavity substrate. Since the thermal conductivity of ceramic is considered high, for example, greater than 15 $W \cdot m^{-1} \cdot K^{-1}$ (aluminum oxide), or greater than 150 $W \cdot m^{-1} \cdot K^{-1}$ (aluminum nitride), an insulating layer with lower thermal conductivity, for example, about 1 $W \cdot m^{-1} \cdot K^{-1}$ (glass) is inserted to space the MEMS oscillator and the oscillation circuit apart from the ceramic cavity substrate, so as to maintain the crystal unit in the OCXO at a constant temperature. Nevertheless, the implementation of a ceramic cavity substrate and the additional insulating layer add to manufacturing cost.

Moreover, the thermal conductivity of the insulating layer (e.g., glass) still cannot effectively prevent heat loss from the crystal oscillator and the oscillation circuit so that more power has to be provided to keep the crystal oscillator and the oscillation circuit at constant temperature.

In some embodiments, present disclosure uses an air cavity or a vacuum cavity as a heat conduction retardation zone to prevent the heat loss from the crystal oscillator and the oscillation circuit. Since air has a thermal conductivity of about 0.026 $W \cdot m^{-1} \cdot K^{-1}$, which is substantially lower than the thermal conductivity of an insulating material such as glass, heat loss from the crystal oscillator and the oscillation circuit can be effectively reduced. Thermal conductivity of vacuum is even lower than that of air. In another aspect of the present disclosure, present disclosure provides an organic substrate for the packaging of the crystal oscillator and the oscillation circuit. Polymeric component of an organic substrate possesses a lower thermal conductivity (<1 $W \cdot m^{-1} \cdot K^{-1}$) than that of the ceramic substrate, and is more cost effective compared to the ceramic cavity substrate and the additional insulating layer such as glass. For example, a molding material-based substrate has a thermal conductivity of about 0.8 to 1 $W \cdot m^{-1} \cdot K^{-1}$, a polyimide substrate has a thermal conductivity of about 0.1 to 0.2 $W \cdot m^{-1} \cdot K^{-1}$, a FR-4 substrate has a thermal conductivity of about 0.3 $W \cdot m^{-1} \cdot K^{-1}$, a liquid crystalline polymer (LCP) substrate has a thermal conductivity of about 0.3 to 0.5 $W \cdot m^{-1} \cdot K^{-1}$, a solder mask layer on an organic substrate has a thermal conductivity of about 0.2 to 0.3 $W \cdot m^{-1} \cdot K^{-1}$. With the combination of organic substrate and the air cavity, not only the manufacturing cost can be reduce, also the power consumption keeping the crystal oscillator and the oscillation circuit at constant temperature can be reduced.

Referring to FIG. 1, FIG. 1 illustrates a cross-sectional view of a semiconductor package structure 10, according to some embodiments of the present disclosure. The semiconductor package structure 10 includes a substrate 100, for example, an organic substrate including, but not limited to, a molding material-based substrate, a polyimide substrate, a FR-4 substrate, a liquid crystalline polymer (LCP) substrate, a core substrate, a coreless substrate, or other substrate composed of organic small molecules or polymers. In some embodiments, polymeric component of the organic substrate possesses a thermal conductivity less than about 1 $W \cdot m^{-1} \cdot K^{-1}$. In some embodiments, the substrate 10 has a first surface 1001 and a recess 1001R depressed from the first surface 1001. Exemplified by a core substrate as illustrated in FIG. 1, the substrate 100 includes a core layer 100A, a dielectric layer 100C, and a patterned circuit layer 100B on each of the upper surface and the lower surface of the core layer 100A. Polymeric component of the organic substrate includes at least the dielectric layer 100C. The first surface 1001 of the substrate 100 may be composed of the polymeric material and thus having a thermal conductivity less than about 1 $W \cdot m^{-1} \cdot K^{-1}$. The recess 1001R is depressed from the first surface 1001 of the substrate 100 by removing a portion of the dielectric layer 100 and a portion of the patterned circuit layer 100B in proximal to the first surface 1001.

A first chip 101 is disposed over the first surface 1001 and covering the recess 1001R. The first chip 101 has a front surface 101A, or an active surface, facing away from the first surface 1001, and a back surface 101B, or a passive surface, facing the first surface 1001. The first chip 101 further includes a control circuit, for example, in proximal to the front surface 101A, configured to control a second chip 102 stacked over the first chip 101. In some embodiments, the first chip 101 further includes a heat source region 101H in proximal to the front surface 101A of the first chip 101. The heat source region 101H may include a resistor pattern exposed from the front surface 101A and ready to conduct heat to an object in physical contact therewith provided with suitable electrical power.

In some embodiments, a cavity 103 is defined by a back surface 101B of the first chip 101 and the first recess 103. A bonding layer 101', for example, a die attached film (DAF), can be positioned at the back surface 101B of the first chip 101 and further define a boundary of the cavity 103. Specifically, the cavity 103 is enclosed by a dielectric sidewall, for example, the sidewall of the dielectric layer 100C exposed to the cavity 103, a conductive sidewall, for example, the sidewall of the patterned circuit layer 100B exposed to the cavity 103, and an upper surface of the core layer 100A exposed to the cavity 103. In some embodiments, the dielectric layer 100C may cover the sidewall of the patterned circuit layer 100B in proximal to the cavity 103, and hence although the portion of the patterned circuit layer 100B is removed under the projection of the first chip 101, the cavity 103 may be enclosed solely by a dielectric sidewall. In some embodiments, the heat source region 101H of the first chip 101 is vertically aligning with the cavity 103 and the second chip 102. The heat source region 101H is configured to conduct heat to the second chip 102 and the cavity 103 serves as a heat retardation zone preventing the heat loss from the first chip 101 and the second chip 102. Specifically, the cavity 103, or the heat retardation zone, overlaps with a vertical projection area of the heat source region 101H, so as to effectively prevent the heat loss from the heat source region 101H by heat conduction. In some embodiments, the cavity 30 may possess a thickness of from about 30 μm to about 40 μm, depending on the thicknesses of the dielectric layer 100C and the patterned circuit layer 100B of the substrate 100.

The second chip 102 is stacked over the front surface 101A of the first chip 101. For example, the second chip is electrically coupled to the first chip 101 via a conductive wire 111A, and the first chip 101 is electrically coupled to the substrate 100 via a conductive wire 111B. Of course, other electrical connections such as conductive vias, conductive pillars, or solder joints can be applied to electrically connect the first chip 101, the second chip 102, and the substrate 100. In some embodiments, a bonding layer 102' is applied over a back surface 102B, or the passive surface, of the second chip 102. The bonding layer 102' may be thin enough to allow effective heat conduction between the heat source region 101H and the second chip 102. The bonding layer 102' may also possess high thermal conductivity material. For example, the bonding layer 102' may be thinner than the bonding layer 101', and the thermal conductivity of the bonding layer 102' may be greater than that of the bonding layer 101'.

The electrical connection is connecting the front surface 102A, or the active surface, of the second chip 102 to the front surface 101A, or the active surface, of the first chip 101. In some embodiments, the first chip 101 is a control chip having a circuit controlling the second chip 102. For example, the first chip 101 is a CMOS chip. In some embodiments, the second chip 102 is a microelectromechanical system (MEMS) oscillator chip which can be controlled by the underlying control chip. In some embodiments, the first chip 101 is configured to maintain a constant temperature of the second chip 102 by the heat source region 101H.

The semiconductor package structure 10 further includes a lid 108 on the substrate 100, covering the first chip 11, the second chip 102, and the cavity 103. The space defined by the lid 108, the first chip 101, and the second chip 102 is another cavity 109. In some embodiments, the cavity 109 is discrete from the cavity 103. In some embodiments, the cavity 109 is connected to the cavity 103, as will be addressed in FIG. 4A and FIG. 4B.

Figure 2:
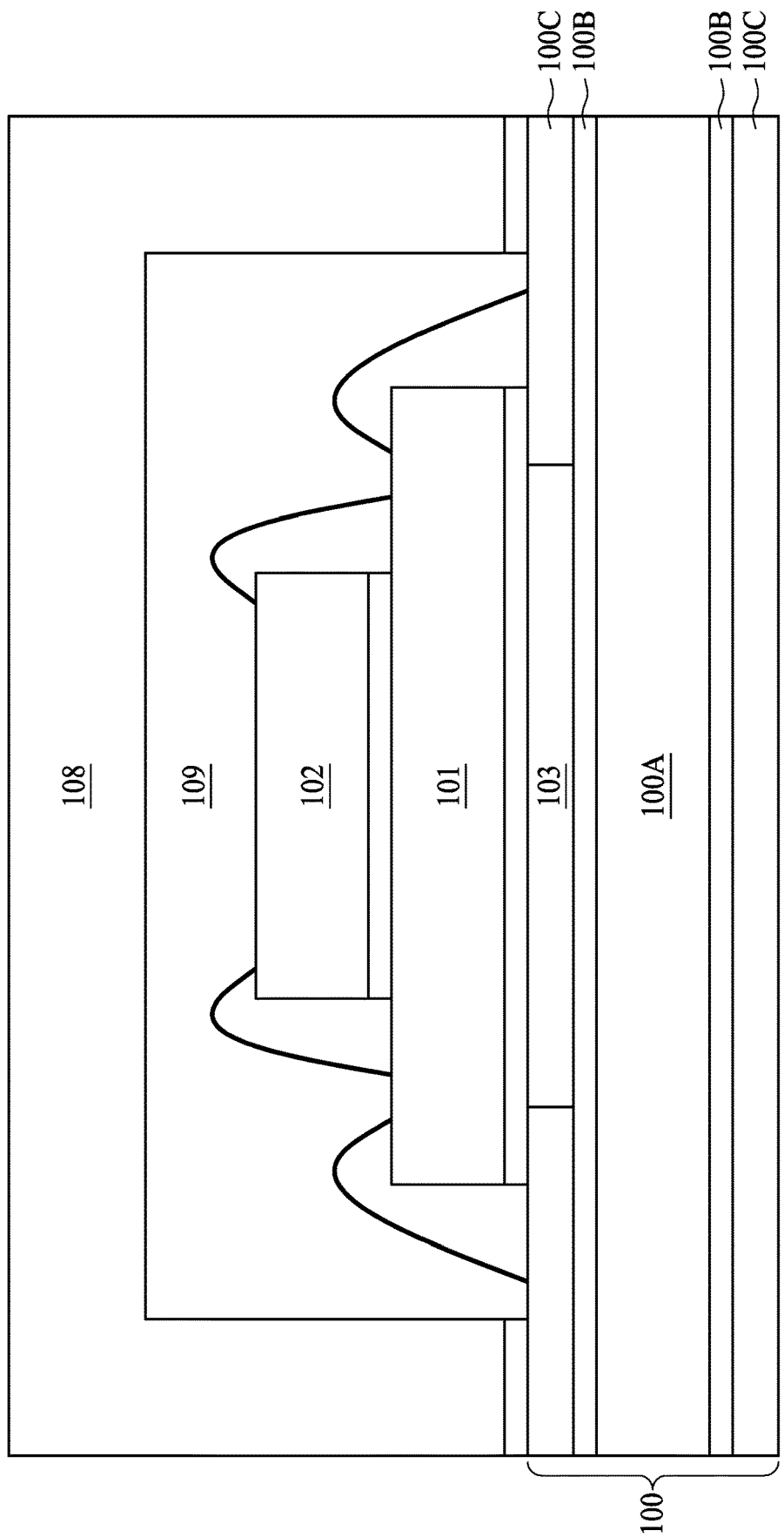
FIG. 2 illustrates a cross-sectional view of a semiconductor package structure, according to some embodiments of the present disclosure.

FIG. 2 illustrates a cross-sectional view of a semiconductor package structure 20, according to some embodiments of the present disclosure. The semiconductor package structure 20 is similar to the semiconductor package structure 10 except for that the patterned circuit layer 100B is not removed from the upper surface of the core layer 100A to form the cavity 103 in FIG. 2. Alternatively stated, the cavity 103 may possess a conductive bottom and a dielectric sidewall.

Figure 3:
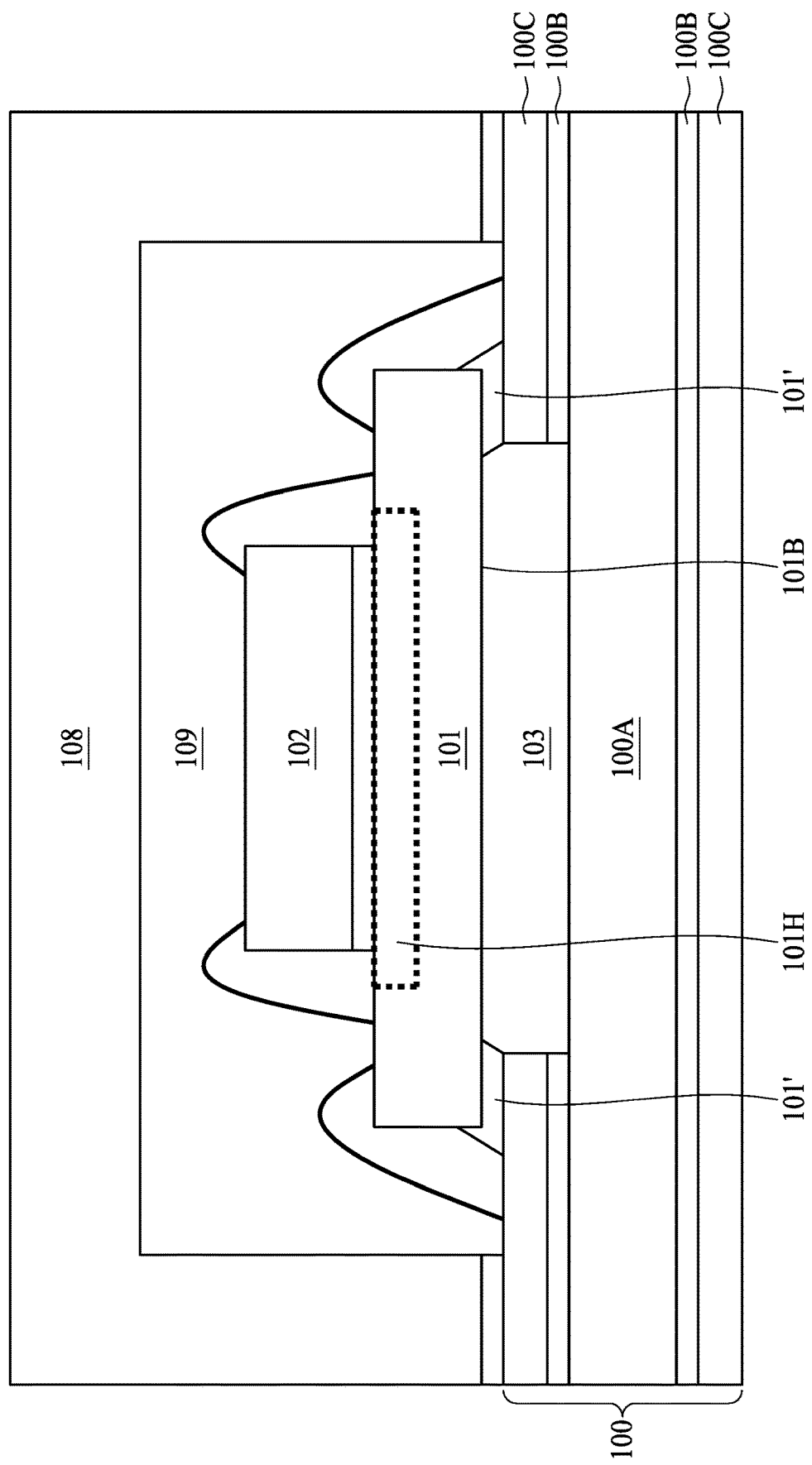
FIG. 3 illustrates a cross-sectional view of a semiconductor package structure, according to some embodiments of the present disclosure.

FIG. 3 illustrates a cross-sectional view of a semiconductor package structure 30, according to some embodiments of the present disclosure. The semiconductor package structure 30 is similar to the semiconductor package structure 10 except for that the bonding layer 101' is selectively in contact with the periphery of the bottom surface 101B of the first chip 101. In some embodiments, the bonding layer 101' localized at the periphery of the bottom surface 101B of the first chip 101 can be composed of epoxy. Since the epoxy has a higher thermal conductivity than that of air or vacuum, in some embodiments, positioning the bonding layer 101' under vertical projection of the heat source region 101H is avoided. As shown in FIG. 3, the bonding layer 101' may form continuous or discrete patterns at the periphery of the first chip 101, connecting the first chip 101 with the substrate 100.

Figure 4B:
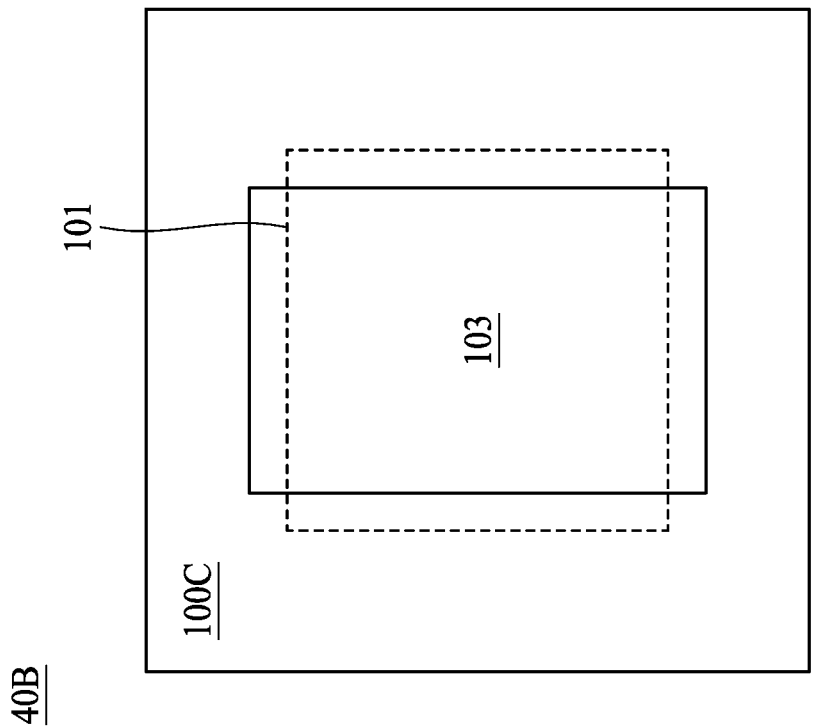
FIG. 4A and FIG. 4B illustrate orientation alignment of a cavity and a semiconductor chip from top view perspectives, according to some embodiments of the present disclosure.
Figure 4A:
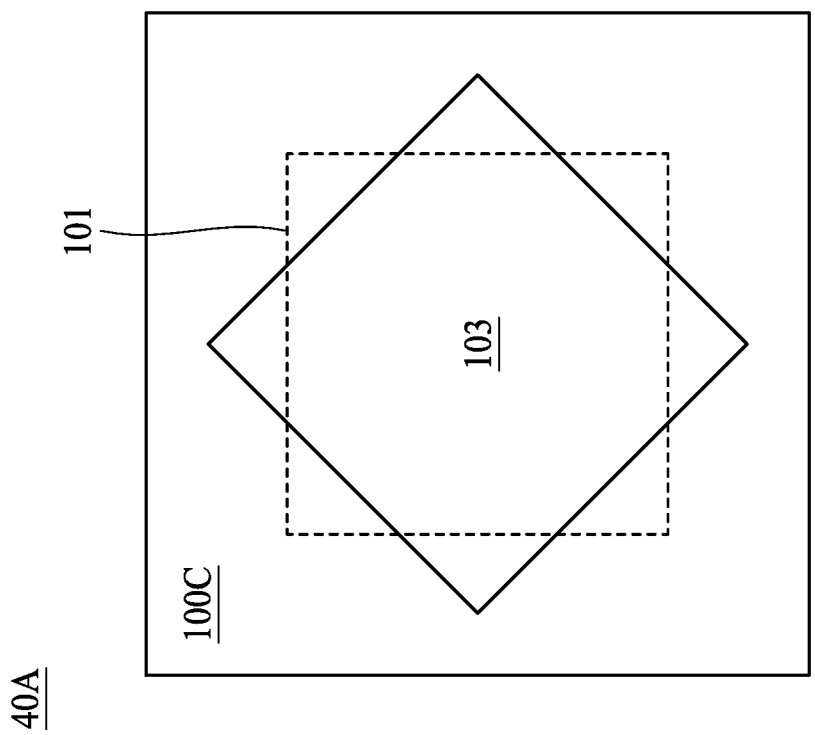

FIG. 4A and FIG. 4B illustrate orientation alignment of a cavity and a semiconductor chip from top view perspectives, according to some embodiments of the present disclosure. In FIG. 4A, the cavity 103 and the first chip 101 may possess substantially identical shape, but the first chip 101 may rotate about 45° with respect to the cavity 103. Four corners of the first chip 101 are selectively in contact with the dielectric layer 100C of the substrate 100. In FIG. 4B, the cavity 103 and the first chip 101 may possess different shapes, for example, the cavity is a tetragonal shape, and the cavity is a square shape. Two sides of the first chip 101 are selectively in contact with the dielectric layer 100C of the substrate 100. The cavity 103 in FIG. 4A and the cavity 103 in FIG. 4B appear to be open cavities where the cavity 103 is in connection with the cavity 109, as illustrated in FIG. 1, because the first chip 101 is not completely covering the opening of the recess 1001R. In some embodiments, the area of the first chip 101 is smaller than the area of the cavity 103 to allow the perforation between the cavity 103 and the cavity 109. Air in the cavity 103 and the cavity 109 is interflowing so as to prevent the overpressure, if a close cavity is adopted, after an elevated temperature operation (e.g., a reflow operation). Serious overpressure may cause the first chip 101 and/or the second chip 102 to break out from the substrate 100.

Figure 5:
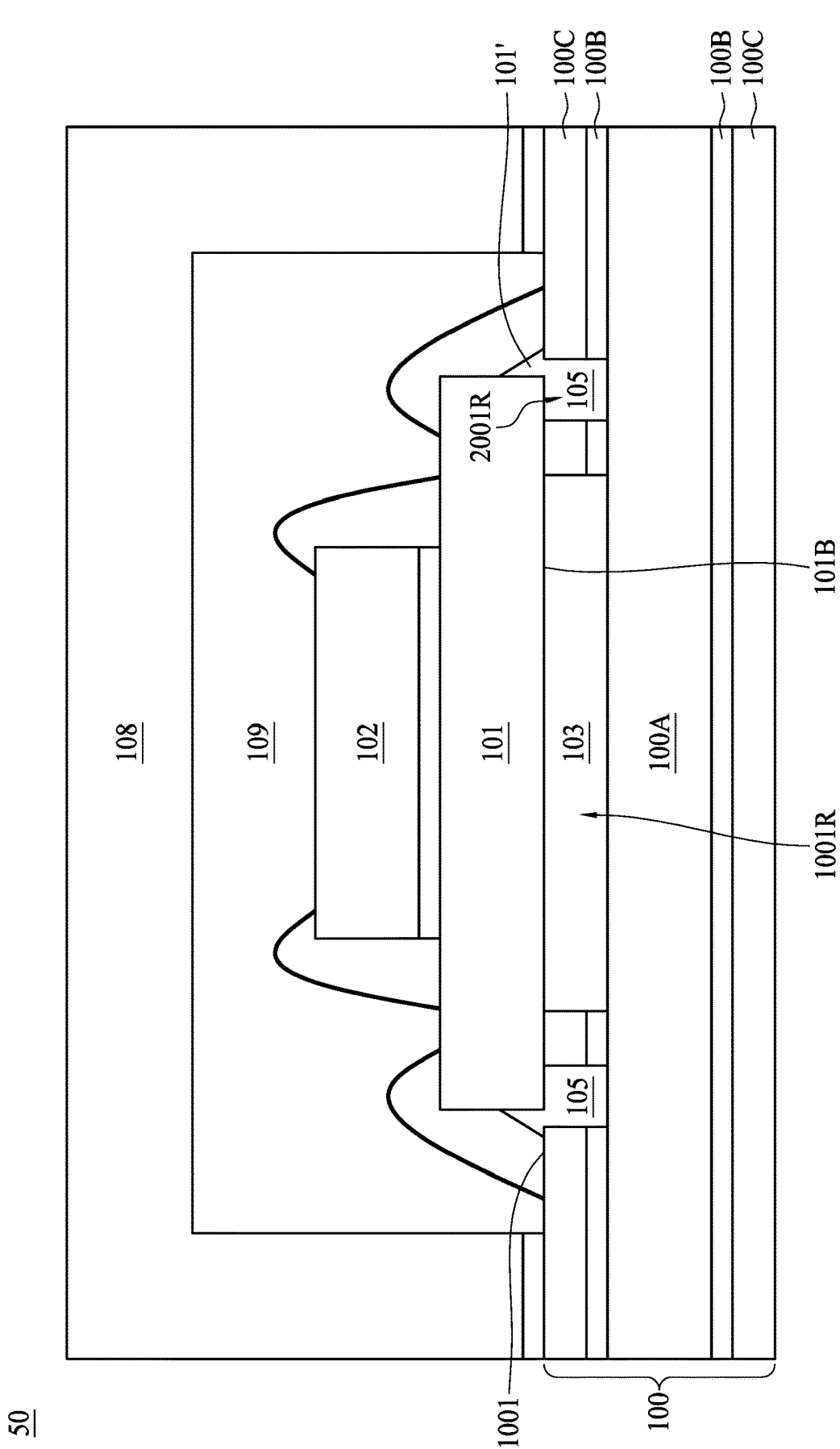
FIG. 5 illustrates a cross-sectional view of a semiconductor package structure, according to some embodiments of the present disclosure.

FIG. 5 illustrates a cross-sectional view of a semiconductor package structure 50, according to some embodiments of the present disclosure. The semiconductor package structure 50 is similar to the semiconductor package structure 10 except for that in addition to the first recess 1001R, a second recess 2001R is depressed from the first surface 1001 of the substrate 100. As shown in FIG. 5, the second recess 2001R surrounds the first recess 1001R. In some embodiments, the first chip 101 covers the first recess 1001R and may or may not cover the entire width of the second recess 2001R. A cavity 105 is formed between the back surface 101B of the first chip 101 and the second recess 2001R. In FIG. 5, the bonding layer 101' is filling the second cavity 105, and configured to bond the first chip 101 to the substrate 100. In some embodiments, excess bonding layer 101' may be observed at the first surface 1001 of the substrate 100, depending on the amount of the bonding material used. In some embodiments, the second cavity 105 may appear as a close trench for accommodating the bonding material, thereby preventing the bonding material from overflowing the first surface 1001 of the substrate 100.

Figure 6:
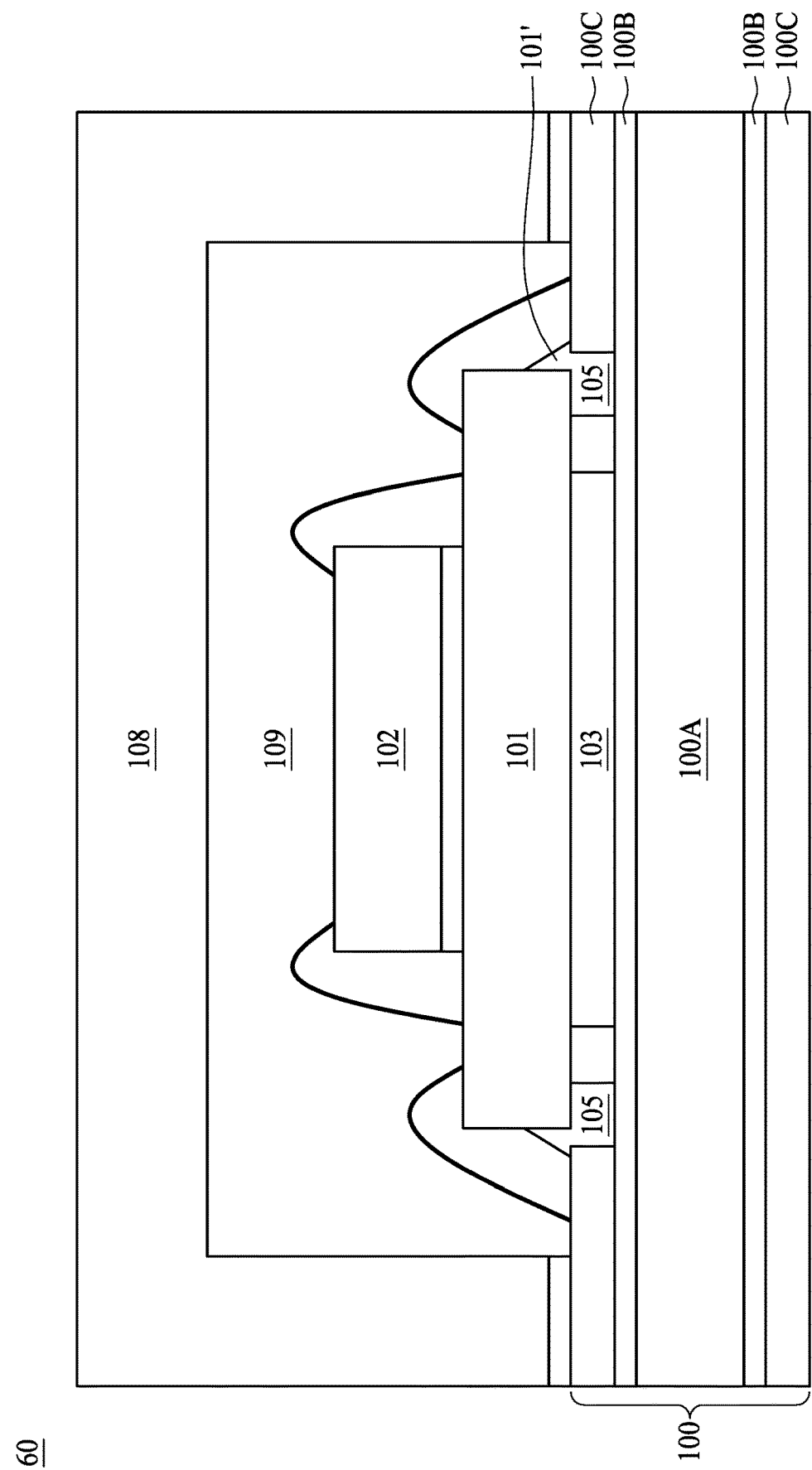
FIG. 6 illustrates a cross-sectional view of a semiconductor package structure, according to some embodiments of the present disclosure.

FIG. 6 illustrates a cross-sectional view of a semiconductor package structure 60, according to some embodiments of the present disclosure. The semiconductor package structure 60 is similar to the semiconductor package structure 50 except for that the patterned circuit layer 100B is not removed from the upper surface of the core layer 100A to form the cavity 103 in FIG. 6. Alternatively stated, the cavity 103 may possess a conductive bottom and a dielectric sidewall, and the cavity 105 may possess a conductive bottom and a dielectric sidewall.

Figure 7B:
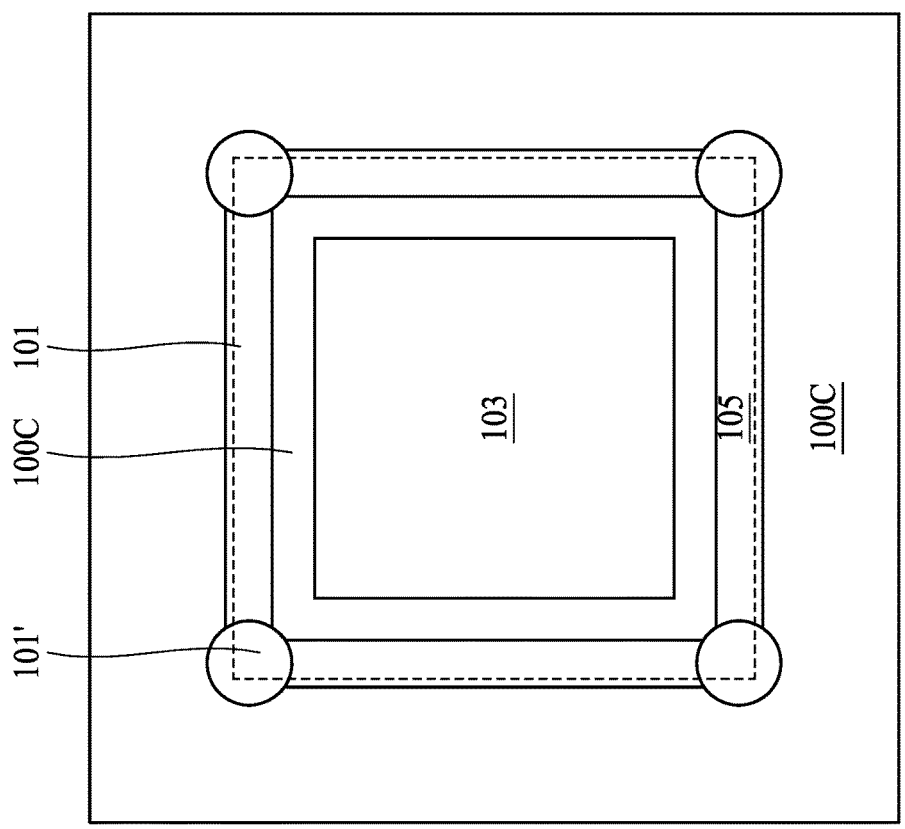
FIG. 7A and FIG. 7B each illustrates a stacking configuration of a plurality of cavities, a semiconductor chip, and/or a bonding layer in the plurality of cavities from top view perspectives, according to some embodiments of the present disclosure
Figure 7A:
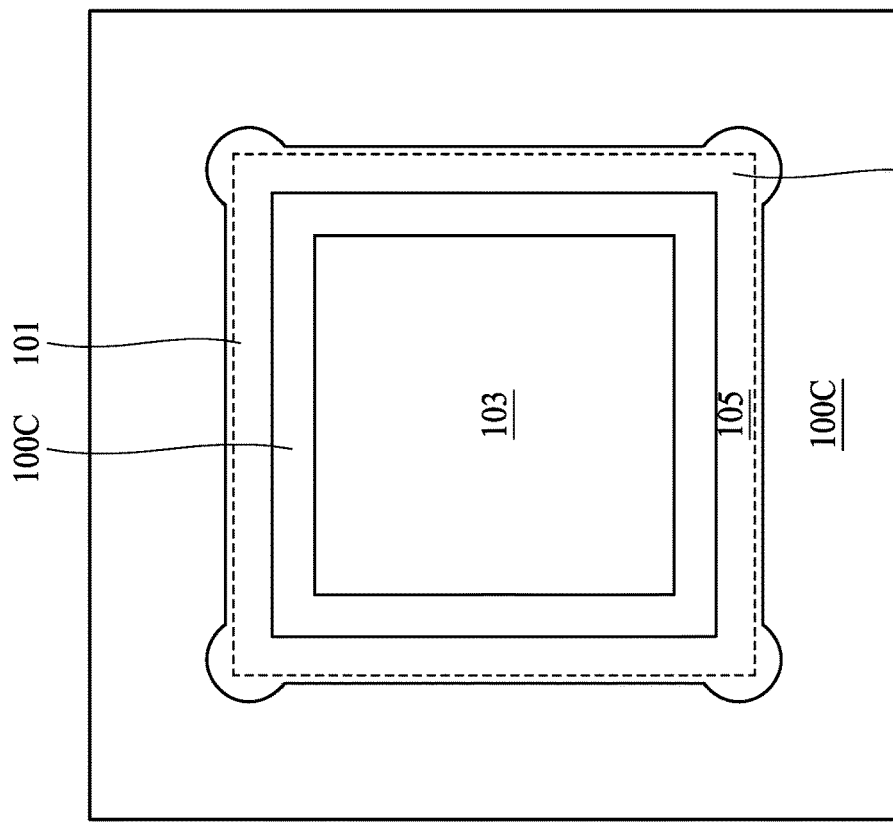

FIG. 7A and FIG. 7B each illustrates a stacking configuration of a plurality of cavities, a semiconductor chip, and/or a bonding layer in the plurality of cavities from top view perspectives, according to some embodiments of the present disclosure. Referring to FIG. 5 and In FIG. 7A, the substrate 100 includes a first cavity 103 and a second cavity 105 at its first surface 1001. The second cavity 105 form a closed trench surrounds the first cavity 103. The first chip 101 illustrated in dotted lines is stacked over the first cavity 103 and partially over the second cavity 105. The bonding layer 101' can be filled in the second cavity 105 with a continuous pattern, configured to connect the first chip 101 and the dielectric layer 100C of the substrate 100. Referring to FIG. 5 and In FIG. 7B, the substrate 100 includes a first cavity 103 and a second cavity 105 at its first surface 1001. The second cavity 105 form a closed trench surrounds the first cavity 103. The first chip 101 illustrated in dotted lines is stacked over the first cavity 103 and partially over the second cavity 105. The bonding layer 101' can be filled in the second cavity 105 with discrete patterns, for example, at four corners of the second cavity 105 from a top view perspective, configured to connect the first chip 101 and the dielectric layer 100C of the substrate 100. In some embodiments, the bonding layer 101' can be filled in the second cavity 105 with other patterns not exemplified in FIG. 7A and FIG. 7B, as long as the bonding strength of between the first chip 101 and the dielectric layer 100C of the substrate 100 is sufficient to withstand subsequent operations and perform desired device function. As illustrated in FIG. 7A and FIG. 7B, the first cavity 103 may be a closed cavity whereas the second cavity 105 may be an open cavity, perforated with the cavity 109 as shown in FIG. 5 and FIG. 6.

Figure 8A:
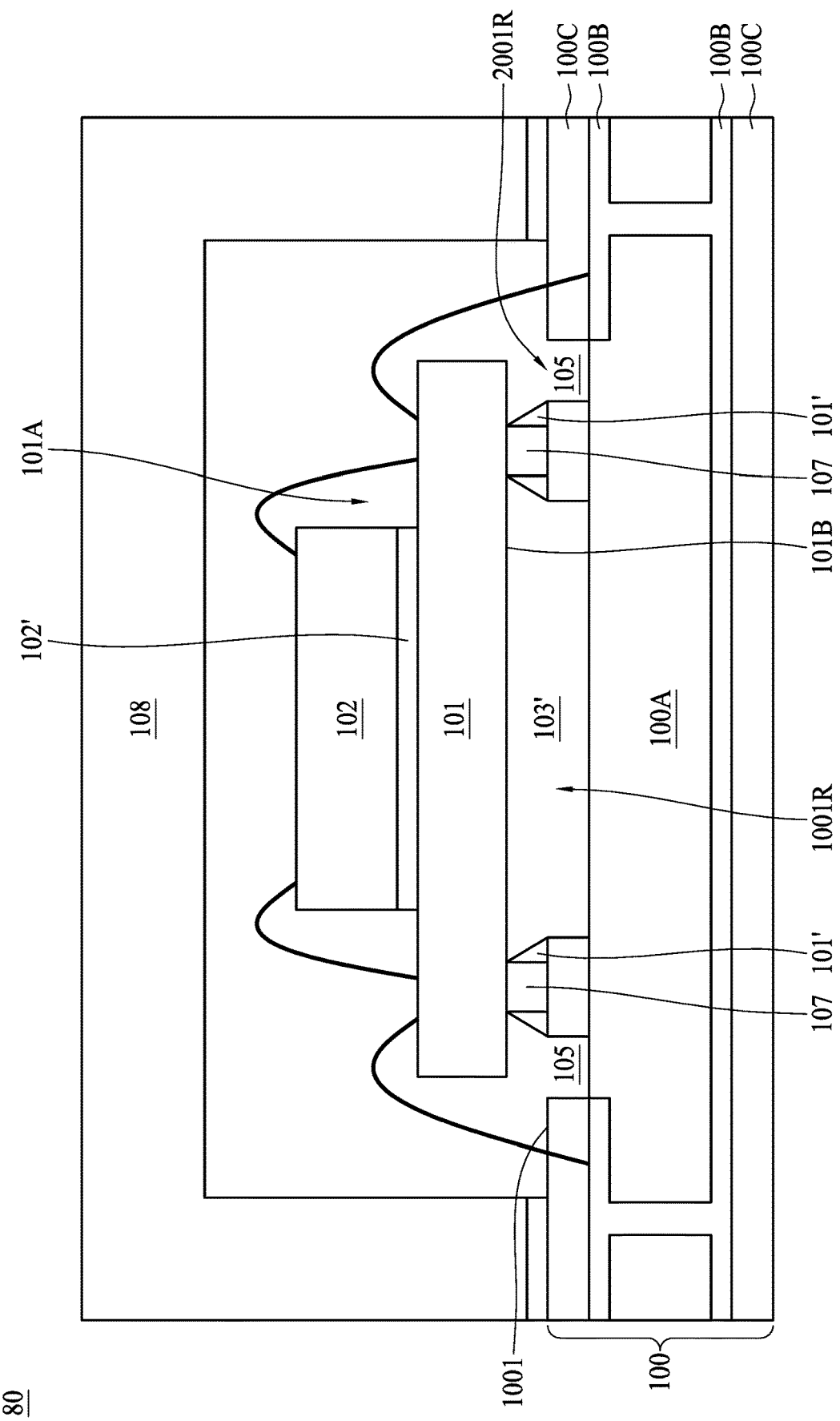
FIG. 8A illustrates a cross-sectional view of a semiconductor package structure, according to some embodiments of the present disclosure.

FIG. 8A illustrates a cross-sectional view of a semiconductor package structure 80, according to some embodiments of the present disclosure. The semiconductor package structure 80 includes a substrate 100. In some embodiments, the substrate 100 includes organic substrates. A first chip 101 is disposed over the first surface 1001 and covering the first recess 1001R. The first chip 101 is connecting to the first surface 1001 of the substrate 100 via a spacing pattern 107. In some embodiments, the spacing pattern 107 is positioned at a periphery of the first chip 101. A cavity 103' is formed between the back surface 101B of the first chip 101, the spacing pattern 107, and the first surface 1001 of the substrate 100. As shown in FIG. 8A, the first surface 1001 of the substrate 100 may be a top surface of the dielectric layer 100C or the top surface of the core layer 100A, depending on the location of the substrate 100 referring to. For example, the cavity 103' is defined by the back surface 101B of the first chip 101, the spacing pattern 107, and the top surface of the core layer 100A. As previously discussed, the cavity 103' can be an air cavity or a vacuum cavity.

The semiconductor package structure 80 further includes a second recess 2001R surrounding the first recess 1001R. The spacing pattern situated on the first surface 1001 of the substrate 100 adjacent to the first recess 1001R and the second recess 2001R. In some embodiments, a bonding layer 101' is disposed near the spacing pattern 107, configured to connect the first chip 101 and the spacing pattern 107 with the substrate 100. In some embodiments, the spacing pattern 107 is composed of permanent photoresist such as SU-8. In some embodiments, the spacing pattern 107 is patterned on the back surface 101B of the first chip 101 under wafer-level operations, as will be discussed in FIG. 9A, FIG. 9B, and FIG. 9C. The adoption of the spacing pattern 107 allows greater design freedom on the separation between the back surface 101B of the first chip 101 and the first surface 1001 of the substrate 100. In some embodiments, the spacing pattern 107 may possess a height of from about 100 μm to about 200 μm.

Figure 8B:
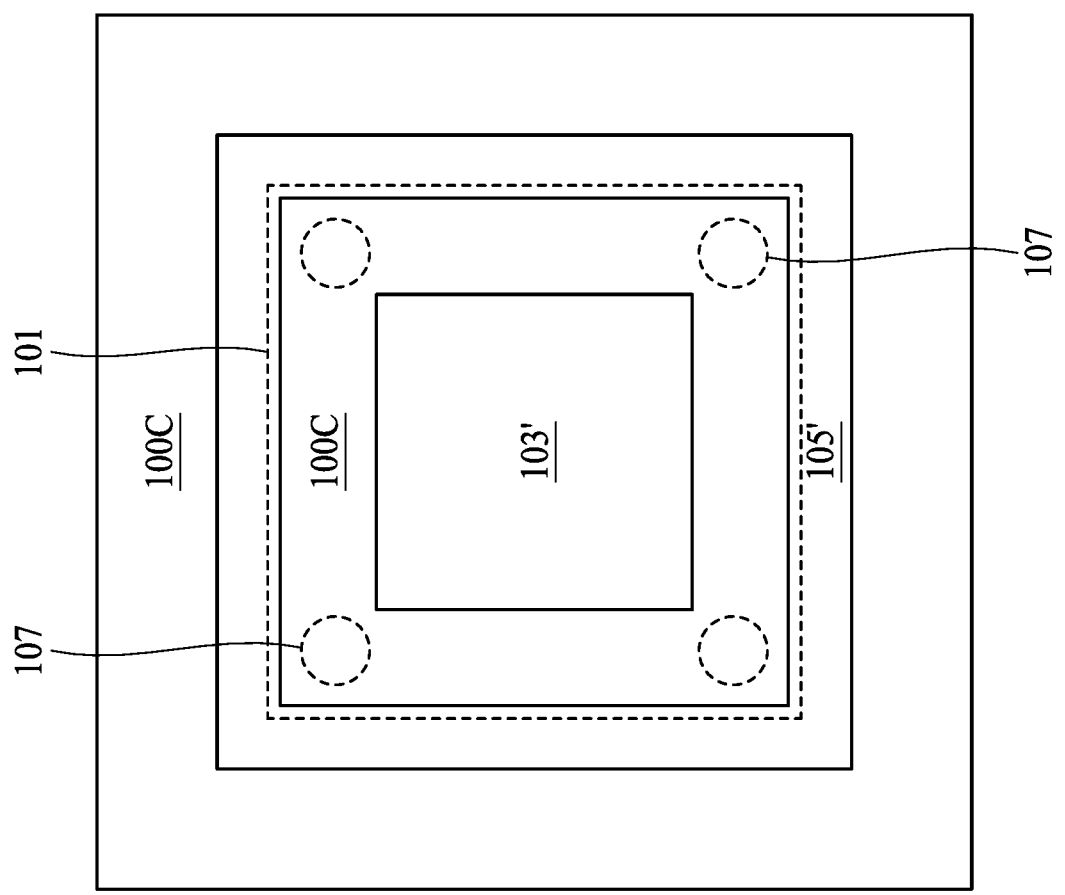
FIG. 8B illustrates a stacking configuration of a plurality of cavities, a spacing pattern, and a semiconductor chip from top view perspectives, according to the embodiment in FIG. 8A of the present disclosure.

FIG. 8B illustrates a stacking configuration of a plurality of cavities, a spacing pattern, and a semiconductor chip from top view perspectives, according to the embodiment in FIG. 8A of the present disclosure. Referring to FIG. 8A and FIG. 8B, the substrate 100 includes a first cavity 103' and a second cavity 105' at its first surface 1001. The second cavity 105' form a closed trench surrounds the first cavity 103'. The first chip 101 illustrated in dotted lines is stacked over the first cavity 103' and partially over the second cavity 105'. The spacing pattern 107 between the first chip 101 and the dielectric layer 100C of the substrate 100 can have a discrete pattern, for example, at the four corners near the periphery of the first chip 101. Although not shown in FIG. 8B, the bonding layer 101' may surrounds the discrete spacing pattern 107.

FIG. 9A illustrates a top view of a semiconductor wafer with a plurality of die regions 901, according to some embodiments of the present disclosure. Since the pattern layer 107 may be formed during wafer-level processing, a discrete pattern of the pattern layer 107 may be formed in each of the die regions 901 prior to the die saw operation. FIG. 9C illustrate a cross section view of the die region 901 along AA', discrete spacing pattern with a desired aspect ratio can be observed.

Figure 10A:
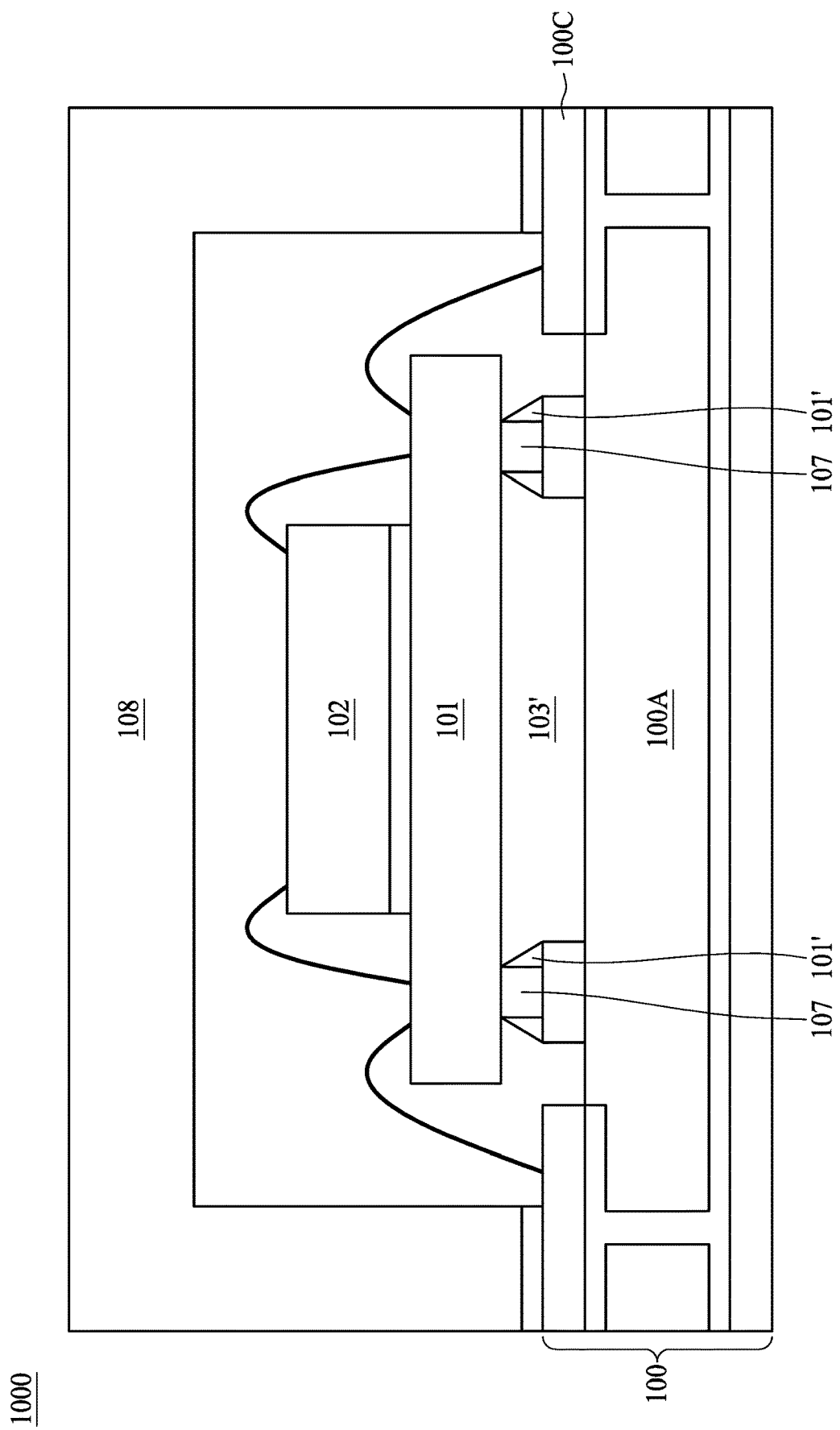
FIG. 10A illustrates a cross-sectional view of a semiconductor package structure, according to some embodiments of the present disclosure.
Figure 10B:
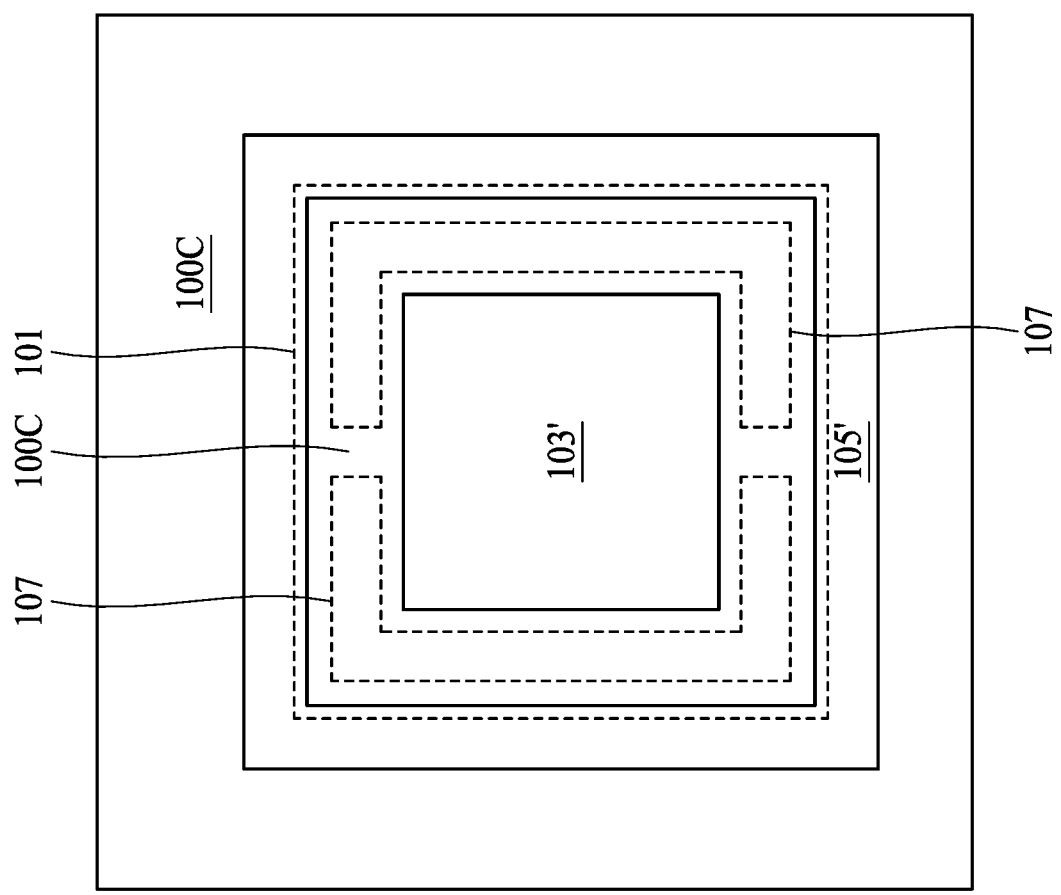
FIG. 10B illustrates a stacking configuration of a plurality of cavities, a spacing pattern, and a semiconductor chip from top view perspectives, according to the embodiment in FIG. 10A of the present disclosure.

FIG. 10A illustrates a cross-sectional view of a semiconductor package structure 1000, according to some embodiments of the present disclosure. The semiconductor package structure 1000 is similar to the semiconductor package structure 80 except for that the spacing pattern 107 is a double c-shaped pattern surrounding the first cavity 103' from a top view perspective, as illustrated in FIG. 10B. Referring to FIG. 10A and FIG. 10B, the substrate 100 includes a first cavity 103' and a second cavity 105' at its first surface 1001. The second cavity 105' forms a closed trench surrounds the first cavity 103'. The first chip 101 illustrated in dotted lines is stacked over the first cavity 103' and partially over the second cavity 105'. The spacing pattern 107 between the first chip 101 and the dielectric layer 100C of the substrate 100 can have a discrete pattern, for example, the double c-shaped pattern. Although not shown in FIG. 10B, the bonding layer 101' may surrounds the discrete spacing pattern 107.

Figure 11B:
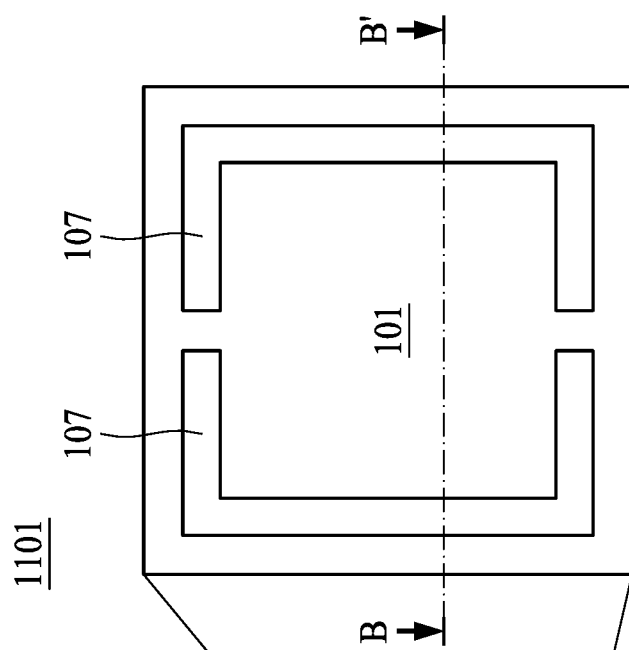
FIG. 11B illustrates one of the plurality of die regions in FIG. 11A with a spacing pattern from a top view perspective, according to some embodiments of the present disclosure.
Figure 11C:
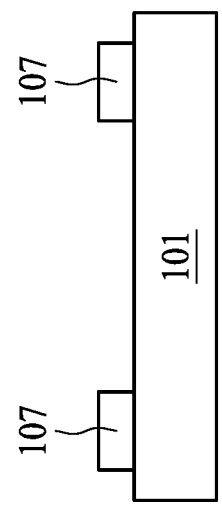
FIG. 11C illustrates one of the plurality of die regions in FIG. 11A with a spacing pattern from a cross sectional view perspective, according to some embodiments of the present disclosure.
Figure 11A:
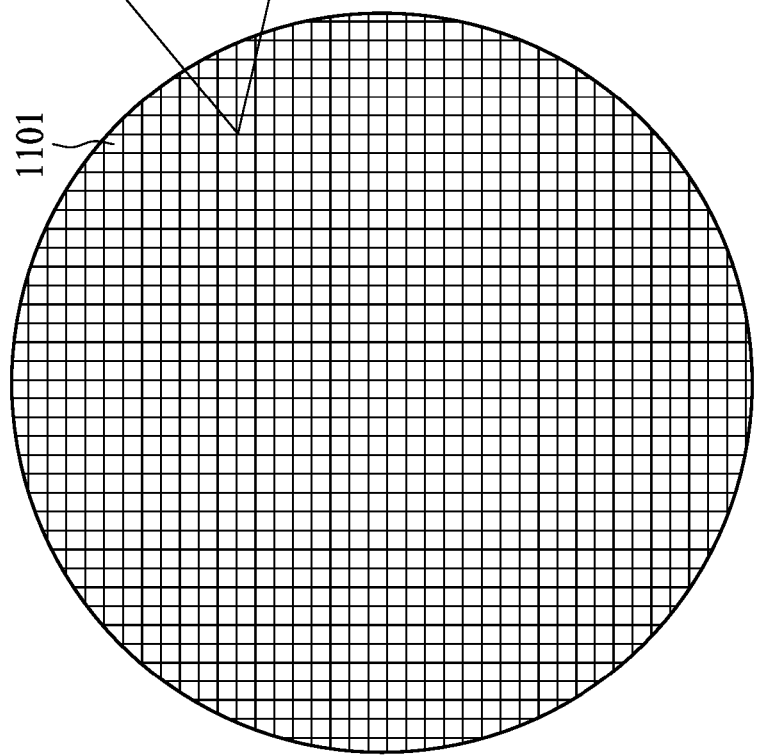
FIG. 11A illustrates a top view of a semiconductor wafer with a plurality of die regions, according to some embodiments of the present disclosure.

FIG. 11A illustrates a top view of a semiconductor wafer with a plurality of die regions 1101, according to some embodiments of the present disclosure. Since the pattern layer 107 may be formed during wafer-level processing, a discrete pattern of the pattern layer 107 may be formed in each of the die regions 1101 prior to the die saw operation. FIG. 11C illustrate a cross section view of the die region 1101 along BB', discrete spacing pattern with a desired aspect ratio can be observed.

Figure 12A:
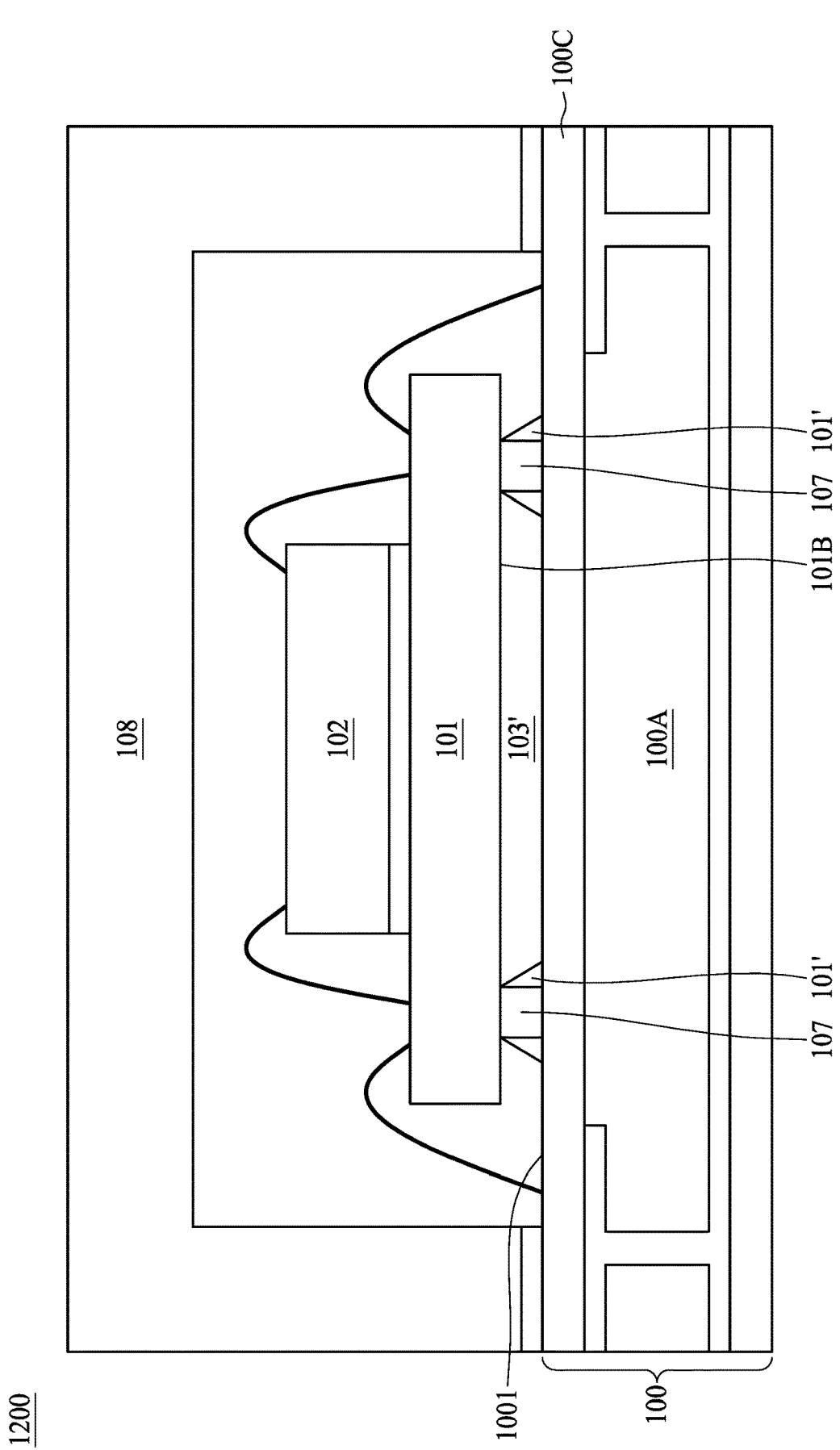
FIG. 12A illustrates a cross-sectional view of a semiconductor package structure, according to some embodiments of the present disclosure.
Figure 12B:
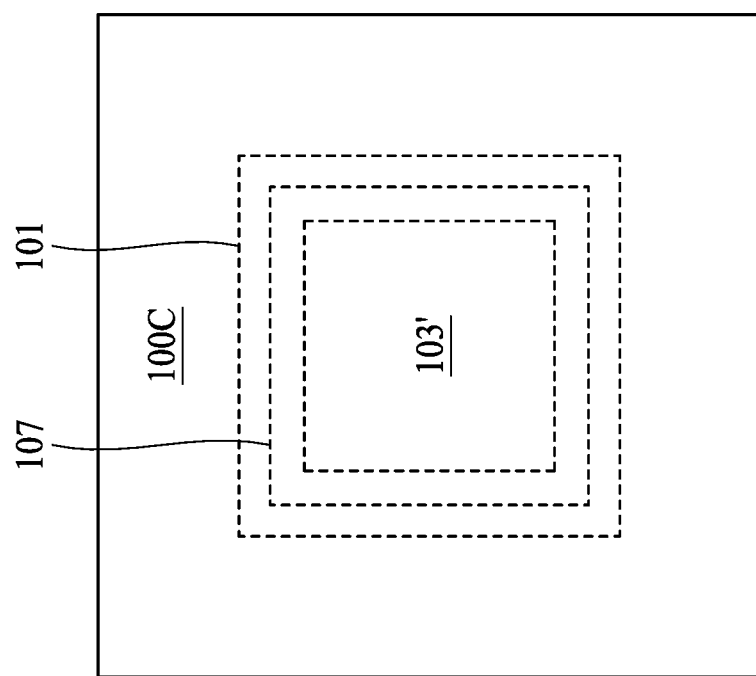
FIG. 12B illustrates a stacking configuration a spacing pattern and a semiconductor chip from top view perspectives, according to the embodiment in FIG. 12A of the present disclosure.

FIG. 12A illustrates a cross-sectional view of a semiconductor package structure 1200, according to some embodiments of the present disclosure. The semiconductor package structure 1200 is similar to the semiconductor package structure 80 except for that the spacing pattern 107 is a closed loop pattern surrounding the first cavity 103' from a top view perspective, as illustrated in FIG. 12B. In addition, no recess is formed on the first surface 1001 of the substrate 100. Therefore, the cavity 103' is defined by the back surface 101B of the first chip 101, the spacing pattern 107, and the dielectric layer 100C of the substrate 100.

Referring to FIG. 12A and FIG. 12B, the substrate 100 includes a first cavity 103' at its first surface 1001. The first chip 101 illustrated in dotted lines is stacked over the first cavity 103'. The spacing pattern 107 between the first chip 101 and the dielectric layer 100C of the substrate 100 can have a continuous pattern, for example, the closed tetragonal shape pattern. Although not shown in FIG. 12B, the bonding layer 101' may surrounds the continuous spacing pattern 107.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
an organic substrate having a first surface;
a first recess depressed from the first surface;
a first chip over the first surface and covering the first recess, thereby defining a first cavity enclosed by a back surface of the first chip and the first recess; and
a second chip over the first chip, wherein the first cavity is an air cavity or a vacuum cavity, and the first cavity and the second chip are vertically aligning with a heat source region of the first chip.

2. The semiconductor package structure of claim 1, further comprising a bonding layer between the back surface of the first chip and the first surface of the organic substrate.

3. The semiconductor package structure of claim 1, wherein the first chip is a control chip and the second chip is a microelectromechanical system (MEMS) oscillator chip.

4. The semiconductor package structure of claim 1, wherein the first cavity is an open cavity.

5. The semiconductor package structure of claim 1, further comprising a second recess depressed from the first surface of the organic substrate, the first chip at least partially covering the second recess, thereby forming a second cavity enclosed by the back surface of the first chip and the second recess.

6. The semiconductor package structure of claim 5, further comprising a bonding layer filling the second cavity.

7. The semiconductor package structure of claim 5, further comprising a bonding layer between the back surface of the first chip and the first surface of the organic substrate.

8. The semiconductor package structure of claim 5, wherein the second cavity surrounds the first cavity.

9. The semiconductor package structure of claim 1, wherein a thermal conductivity of the first surface of the organic substrate is less than 1 $W \cdot m^{-1} \cdot K^{-1}$.

10. A semiconductor package structure, comprising:
an organic substrate having a first surface;
a first chip over the first surface and connecting to the first surface via a spacing pattern, thereby defining a first cavity enclosed by a back surface of the first chip, the spacing pattern, and the first surface of the organic substrate;
a second chip over the first chip, wherein the first cavity is an air cavity or a vacuum cavity; and
a bonding layer on the first surface of the organic substrate and surrounding the spacing pattern.

11. The semiconductor package structure of claim 10, wherein the first chip is a control chip and the second chip is a microelectromechanical system (MEMS) oscillator chip.

12. The semiconductor package structure of claim 10, further comprising a lid on the organic substrate, covering the first chip and the second chip, thereby defining a second cavity connecting with the first cavity.

13. A semiconductor package structure, comprising:
a substrate having a first surface;
a control chip over the first surface, the control chip having a heat source region adjacent to an active surface of the control chip;
an oscillator chip over the control chip, thermally conducting with the heat source region;
a heat conduction retardation zone under a passive surface of the control chip and overlapping with a vertical projection area of the heat source region; and
a bonding layer between the passive surface of the control chip and the first surface of the substrate,
wherein the heat conduction retardation zone is defined by the passive surface of the control chip and the first surface of the substrate.

14. The semiconductor package structure of claim 13, wherein the heat conduction retardation zone is filled with air.

15. The semiconductor package structure of claim 13, wherein the first surface of the substrate comprises a recess depressed from the first surface, and the heat conduction retardation zone comprises the recess.

16. The semiconductor package structure of claim 13, further comprising a spacing pattern between the passive surface of the control chip and the first surface of the substrate, the spacing pattern surrounding the heat conduction retardation zone.

17. The semiconductor package structure of claim 13, wherein the substrate comprises an organic substrate.

* * * * *